US011519755B2

(12) United States Patent
Cheng et al.

(10) Patent No.: US 11,519,755 B2
(45) Date of Patent: Dec. 6, 2022

(54) CAPACITIVE-SENSING ROTARY ENCODERS AND METHODS

(71) Applicant: Texas Instruments Incorporated, Dallas, TX (US)

(72) Inventors: Lichang Cheng, Shanghai (CN); Jun Zhang, Shanghai (CN); Rujun Ji, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/868,596

(22) Filed: May 7, 2020

(65) Prior Publication Data

US 2020/0264015 A1    Aug. 20, 2020

Related U.S. Application Data

(63) Continuation of application No. 15/704,179, filed on Sep. 14, 2017, now Pat. No. 10,684,143, which is a
(Continued)

(51) Int. Cl.
*G01D 5/241* (2006.01)
*G01R 27/26* (2006.01)
*F16C 41/00* (2006.01)

(52) U.S. Cl.
CPC ......... *G01D 5/2415* (2013.01); *F16C 41/007* (2013.01); *G01R 27/2605* (2013.01)

(58) Field of Classification Search
CPC .... G01D 5/241; G01D 5/2412; G01D 5/2415; G01R 27/2605; G01R 31/36; G01R 31/3828; G01R 31/3842; G01R 33/02; G01R 31/34; F16C 41/007; F16C 19/181; F16C 2300/14; H02P 7/06; H02P 21/06;
(Continued)

(56) References Cited

U.S. PATENT DOCUMENTS 4,550,221 A    10/1985 Mabusth
4,779,094 A    10/1988 Lee
(Continued)

FOREIGN PATENT DOCUMENTS

CN    101206126 C    6/2008
CN    101556170 A    10/2009
(Continued)

OTHER PUBLICATIONS

Cypress Semiconductor, "AN64846 Getting Started with CapSense", Document No. 001-64846, Copyright 2010-2016, 127 pages.
(Continued)

*Primary Examiner* — Vinh P Nguyen
(74) *Attorney, Agent, or Firm* — Krista Y. Chan; Charles A. Brill; Frank D. Cimino

(57) ABSTRACT

Example capacitive-sensing rotary encoders and methods are disclosed herein. An example apparatus includes a rotary encoder structured to be mounted to a motor, the rotary encoder including a plurality of circumferential capacitive sensor arrays, each of the plurality of capacitive sensor arrays having an output representing a binary bit of a rotary encoder output, the rotary encoder output changing as a conductor rotates responsive to a rotatable shaft of the motor relative to the rotary encoder.

20 Claims, 8 Drawing Sheets

Related U.S. Application Data continuation of application No. PCT/CN2017/084166, filed on May 12, 2017.

(58) Field of Classification Search
CPC ...... H02P 6/16; H02P 5/74; H02P 6/08; H02P 5/00; H02P 23/16; H02P 6/006; H02P 6/10; H02P 6/12; H02P 6/188; H02P 6/30; H02P 9/009; H02P 21/18; H02P 5/50; H02P 7/00; H02P 6/17; G01L 1/142; G01L 5/0014; G01P 3/366; G01P 3/806; G01P 3/42; G01P 3/481; G01P 3/489; G01P 1/10; G01P 3/44; G01P 3/443; G01P 3/487; G01P 13/045; G01P 15/105; G01P 15/125; G01P 15/18; G01P 21/02; G01P 3/486; G01P 3/488

See application file for complete search history.

(56) References Cited

U.S. PATENT DOCUMENTS

| | | | | |
|---|---|---|---|---|
| 4,788,422 | A * | 11/1988 | Fujiwara | H03M 1/301 |
| | | | | 250/237 G |
| 4,851,835 | A * | 7/1989 | Krumholz | G01D 5/2412 |
| | | | | 324/660 |
| 4,862,752 | A | 9/1989 | Hoyt | |
| 5,172,039 | A * | 12/1992 | Owens | G01D 5/2415 |
| | | | | 340/870.37 |
| 5,239,307 | A * | 8/1993 | Andermo | G01D 5/2412 |
| | | | | 324/660 |
| 5,311,666 | A * | 5/1994 | Jacobsen | G01D 5/2415 |
| | | | | 33/1 N |
| 5,880,683 | A * | 3/1999 | Brandestini | G01D 5/2492 |
| | | | | 341/10 |
| 6,170,162 | B1 | 1/2001 | Jacobsen | |
| 6,218,803 | B1 | 4/2001 | Montagu | |
| 6,892,590 | B1 | 5/2005 | Andermo | |
| 7,129,935 | B2 | 10/2006 | Mackey | |
| 8,059,015 | B2 | 11/2011 | Hua et al. | |
| 8,089,288 | B1 * | 1/2012 | Maharita | G06F 3/03547 |
| | | | | 324/678 |
| 11,060,889 | B2 * | 7/2021 | Ji | H02K 11/21 |
| 2006/0176189 | A1 * | 8/2006 | Bar-On | G01D 5/2405 |
| | | | | 340/870.37 |
| 2007/0261258 | A1 * | 11/2007 | Ahn | G01C 9/06 |
| | | | | 33/366.19 |
| 2008/0117731 | A1 | 5/2008 | Moro | |
| 2010/0097078 | A1 | 4/2010 | Philipp et al. | |
| 2010/0148801 | A1 | 6/2010 | Uchida | |
| 2010/0225309 | A1 * | 9/2010 | Takahashi | G01D 5/2452 |
| | | | | 324/207.25 |
| 2010/0301840 | A1 | 12/2010 | Filatov | |
| 2012/0105080 | A1 | 5/2012 | Iwasawa | |
| 2012/0278033 | A1 | 11/2012 | Bucher | |
| 2013/0120053 | A1 | 5/2013 | Mei | |
| 2014/0368222 | A1 | 12/2014 | Curtis | |
| 2016/0147582 | A1 * | 5/2016 | Karakulak | G06F 11/073 |
| | | | | 714/37 |
| 2016/0148702 | A1 * | 5/2016 | Karakulak | G11C 29/021 |
| | | | | 365/185.12 |

FOREIGN PATENT DOCUMENTS

| | | |
|---|---|---|
| CN | 102798405 A | 11/2012 |
| CN | 103124896 A | 5/2013 |
| CN | 103528605 A | 1/2014 |
| CN | 104280053 A | 1/2015 |
| CN | 105393090 A | 3/2016 |
| CN | 106415190 A | 2/2017 |
| CN | 206146435 U | 5/2017 |
| EP | 1680653 A1 | 6/2006 |
| JP | 2005061964 A | 3/2005 |
| WO | WO 2005045387 A1 | 11/2003 |

OTHER PUBLICATIONS

Madaan et al., "Capacitive Sensing Made Easy, Part 1: An Introduction to Different Capacitive Sensing Technologies", Cypress Semiconductor Corp., Apr. 2012, 8 pages.
"Definition of an Encoder", accessed on Mar. 1, 2017, [http://www.bierlemartin.de/hengstler/training/encdef.htm], 5 pages.
Simpkins et al., "Position Estimation and Control of Compact BLDC Motors Based on Analog Linear Hall Effect Sensors", 2010 American Control Conference, Jun. 30-Jul. 2, 2010.
Texas Instruments, "PCB-Based Capacitive Touch Sensing With MSP430", Application Report, Jun. 2007, 25 pages.
Pradhyum Ramkumar, "Capacitive touch and MSP microcontrollers", Texas Instruments, Nov. 2015, 5 pages.
Texas Instruments, "TI Designs CapTIvate E-Lock Design Guide", Nov. 2016, 20 pages.
International Search Report and Written Opinion, PCT/CN2017/084166, dated Feb. 24, 2018 (11 pages).
International Search Report and Written Opinion, PCT/CN2017/084168, dated Feb. 24, 2018 (9 pages).
Extended European Search Report, App No. / Patent No. 19709115.2-1010/3622256; PCT/CN201704166; dated Apr. 15, 2020; 10 pages.

* cited by examiner

CAPACITIVE-SENSING ROTARY ENCODERS AND METHODS

CROSS-REFERENCE TO RELATED APPLICATIONS

This application is a continuation of U.S. patent application Ser. No. 15/704,179, filed Sep. 14, 2017, which claims the benefit of and priority to PCT/CN2017/084166, filed May 12, 2017. Each of which is hereby fully incorporated herein by reference.

FIELD OF THE DISCLOSURE

The present disclosure relates generally to rotary encoders and, more particularly, to capacitive-sensing rotary encoders and methods.

BACKGROUND

Motors convert supplied energy (e.g., electrical, hydro, natural gas, propane, gasoline, diesel, etc.) into mechanical energy in the form of, for example, a rotating shaft. Some flow meters determine an amount of fluid that has flowed by tracking the number of rotations of a rotating shaft of a motor.

SUMMARY

Figure 1:
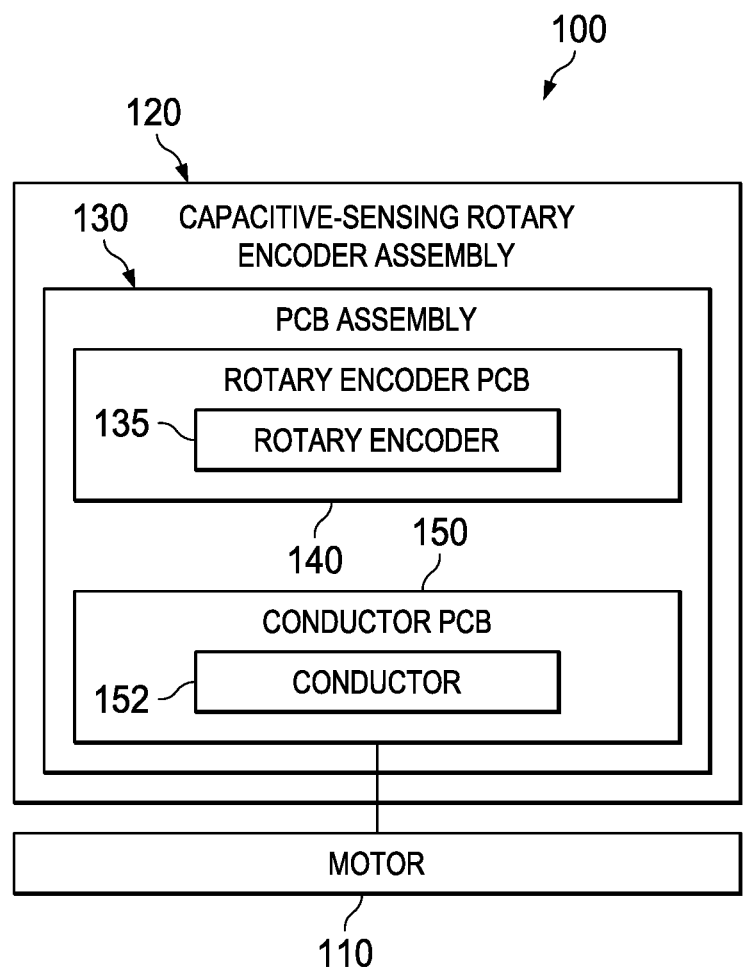
FIG. 1 is a block diagram of an example motor assembly having a capacitive-sensing rotary encoder assembly, in accordance with this disclosure.

Example capacitive-sensing rotary encoders and methods for are disclosed. The examples disclosed herein may be used to perform, for example, motor control and flow meters. An example apparatus includes a rotary encoder structured to be mounted to a motor, the rotary encoder including a plurality of circumferential capacitive sensor arrays, each of the plurality of capacitive sensor arrays having an output representing a binary bit of a rotary encoder output, the rotary encoder output changing as a conductor rotates responsive to a rotatable shaft of the motor relative to the rotary encoder.

DETAILED DESCRIPTION

In some example uses of motors, it is beneficial to quickly and accurately determine angular position. For example, angular position is useful for motor control and flow meter applications. In some examples, rotary encoders are used to convert the angular position of a rotatable shaft to an analog or digital code. Some solutions include encoders manufactured by Leine & Linde AB, and rotary optical encoders. However, Leine & Linde AB encoders have low resolution, and rotary optical encoders are prone to reliability and alignment issues. Capacitive-sensing rotary encoders that overcome at least these problems are disclosed herein. The disclosed example capacitive-sensing rotary encoders can also be implemented to have lower power consumption than rotary optical encoders. The examples disclosed herein can be used to implement absolute encoders and incremental encoders. Outputs of the disclosed capacitive-sensing rotary encoders can be processed to, for example, remove initial location information, determine encoder direction, count rotations, etc.

Reference will now be made in detail to non-limiting examples of this disclosure, examples of which are illustrated in the accompanying drawings. The examples are described below by referring to the drawings, wherein like reference numerals refer to like elements. When like reference numerals are shown, corresponding description(s) are not repeated and the interested reader is referred to the previously discussed figure(s) for a description of the like element(s).

Figure 2:
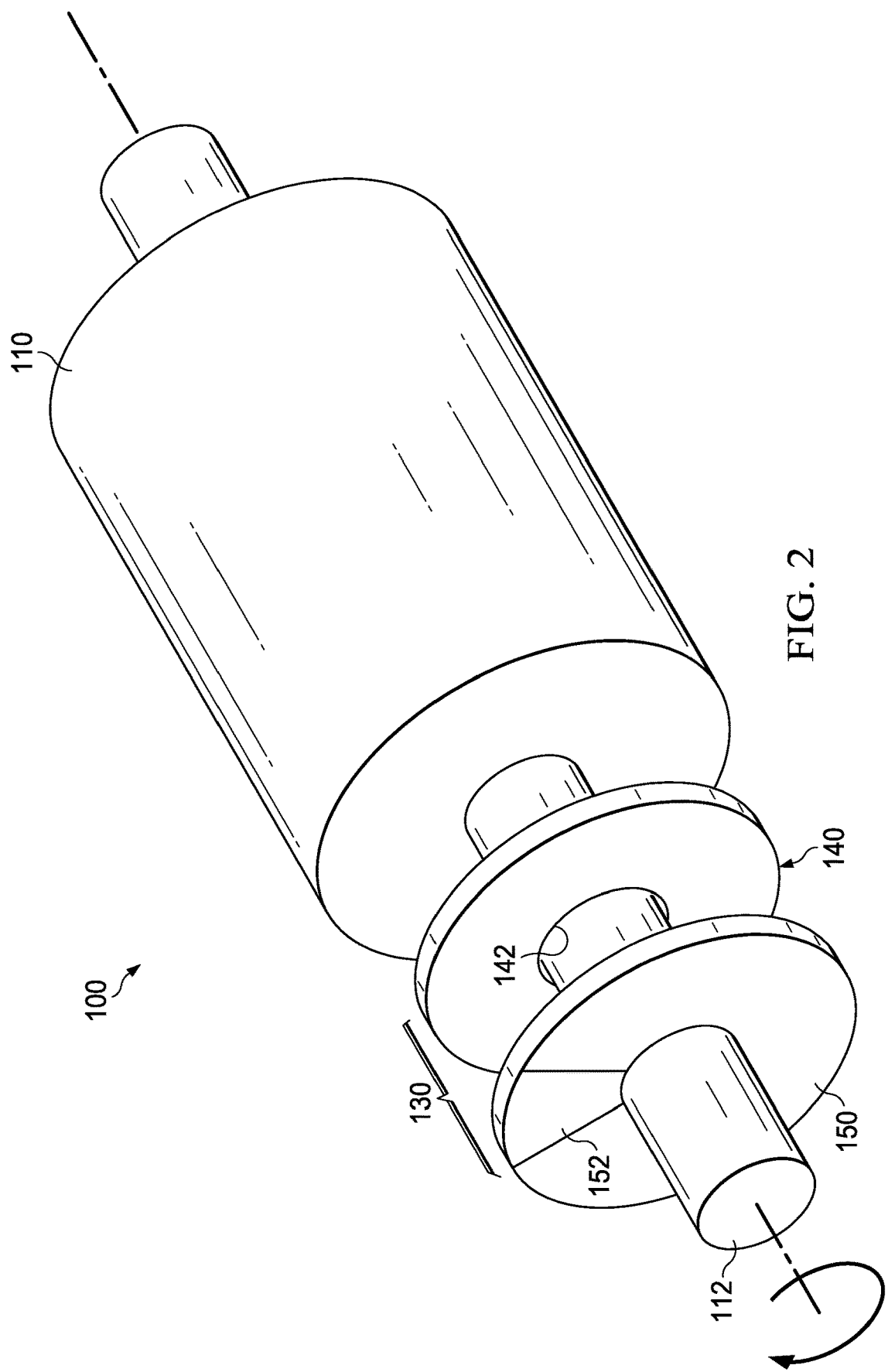
FIG. 2 is a perspective partially-exploded view of the example motor assembly of FIG. 1.

FIG. 1 is a block diagram of an example motor assembly 100 having an example motor 110, and an example capacitive-sensing rotary encoder assembly 120, in accordance with this disclosure. FIG. 2 is a partially-exploded perspective view of the example motor assembly 100 of FIG. 1. As shown in FIG. 2, the example motor 110 has an example rotatable shaft 112 that can be used to, for example, perform purposeful work.

To sense motor position (e.g., an angular position of the rotatable shaft 112), the example capacitive-sensing rotary encoder assembly 120 includes an example printed circuit board (PCB) assembly 130 having an example rotary encoder 135 implemented on, for example, an example rotary encoder PCB 140, and an example conductor PCB 150. In some examples, the rotary encoder PCB 140 includes an opening 142 (e.g., circular) through which the rotatable shaft 112 passes, allowing the rotary encoder PCB 140 to remain stationary with respect to rotation of the rotatable shaft 112 (see FIG. 2). In some examples, the conductor PCB 150 is fixedly attached to the rotatable shaft 112, rotating together with the rotatable shaft 112 with respect to the rotary encoder PCB 140. The example conductor PCB 150 includes an example conductor 152 (e.g., a copper pad) having an example radial shape. As disclosed in more detail below, as the conductor PCB 150 rotates relative to the rotary encoder PCB 140, the example conductor 152 changes the capacitances of sensing capacitors of the rotary encoder PCB 140.

Figure 3:
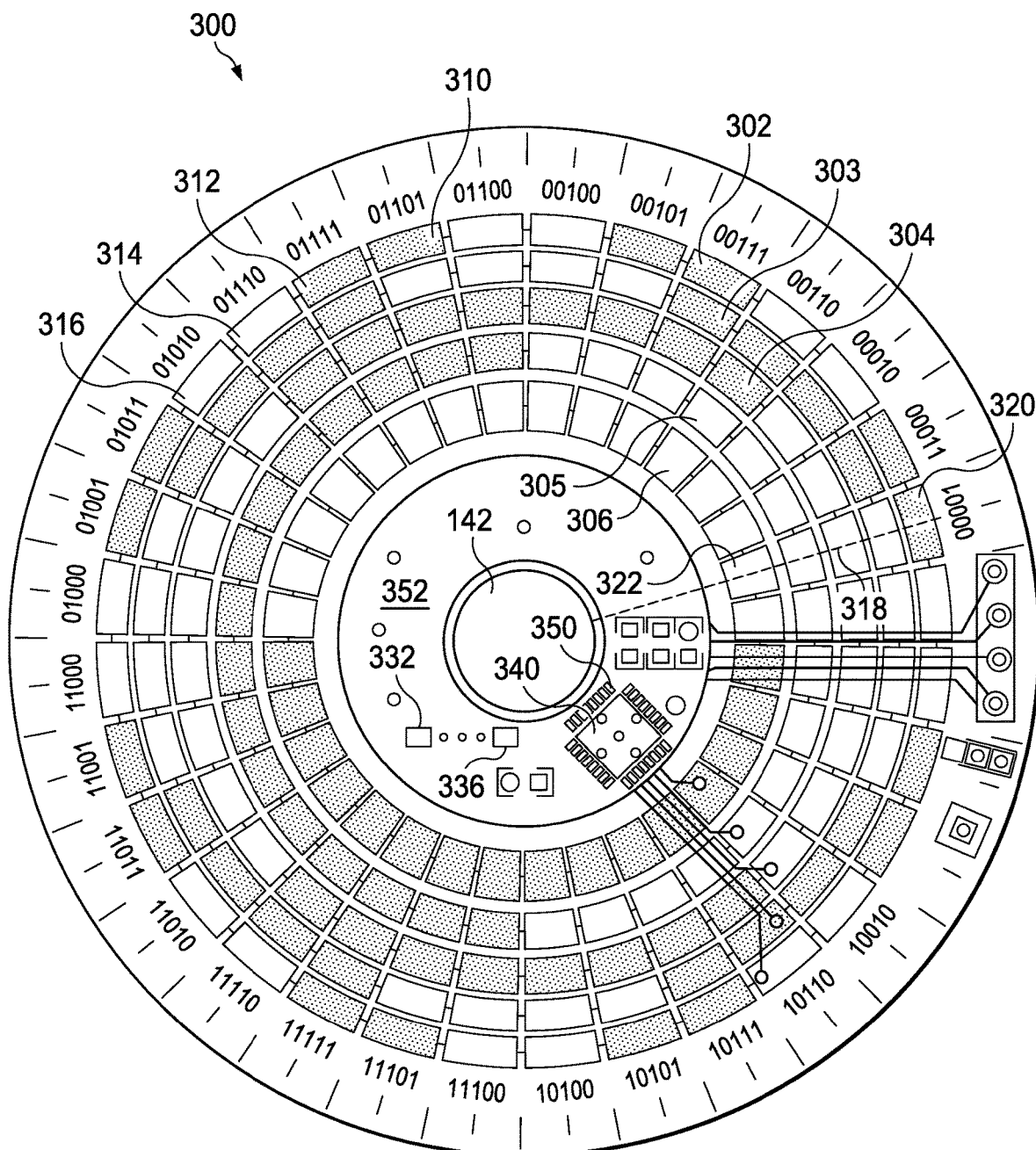
FIG. 3 is a schematic view of an example rotary encoder printed circuit board (PCB), in accordance with the disclosure.

FIG. 3 is a schematic diagram of an example rotary encoder PCB 300 that may be used to implement the example rotary encoder PCB 140 of FIGS. 1 and 2. The example rotary encoder PCB 300 of FIG. 3 includes circumferential capacitive sensor arrays 302, 303, 304, 305 and 306. The example capacitive sensor arrays 302-306 of FIG. 3 are concentric. As will be explained further below, each of the capacitive sensor arrays 302-306 corresponds to one bit of a rotary encoder output. The rotary encoder output represents the output(s) of the capacitive-sensing rotary encoding assembly 120. An example rotary encoder output is a binary word having a least significant bit (LSB) corresponding to the capacitive sensor array 302, and a most significant bit (MSB) corresponding to the capacitive sensor array 306, with the intervening bits of the rotary encoder output corresponding to respective ones of the capacitive sensor arrays 302-305. While the example of FIG. 3 has 5 capacitive sensor arrays 302-306 corresponding to 5 bits of a rotary encoder output, capacitive-sensing rotary encoders having rotary encoder outputs with other numbers of bits may be implemented, according to the examples disclosed herein.

Each of the example capacitive sensor arrays 302-306 of FIG. 3 includes an example arrangement of example capacitive sensing regions (two of which are designated at reference numerals 310 and 312 for the example capacitive sensing array 302) and example non-sensing regions (two of which are designated at reference numerals 314 and 316 for the example capacitive sensing array 302). As shown, the capacitive sensing regions 310, 312 within each capacitive sensor array 302-306 are electrically coupled. Thus, the capacitive sensing regions 310, 312 within each capacitive sensor array 302-306 collectively implement a combined sensing capacitor for the capacitive sensor array 302-306. The example non-sensing regions 314, 316 are non-conductive and, thus, are not part of the combined sensing capacitors of the capacitive sensor arrays 302-306.

As a radially-shaped conductor, such as the conductor 152, rotates to various angles or angular positions (e.g., an example angle 318), it successively overlaps portions of each of the capacitive sensor arrays 302-306 (e.g., an example portion 320 of the capacitive sensor array 302, and an example portion 322 of the capacitive sensor array 306). As will be explained below, when the conductor is proximate to (e.g., partially overlaps, aligned with, etc.) the portion 320 corresponding to a capacitive-sensing region of the capacitive sensor array 302, the capacitance of the combined sensing capacitor of the capacitive sensor array 302 changes (e.g., increases). This increase in capacitance can be detected, and used to set the bit of the rotary encoder output corresponding to the capacitive sensor array 302 to a logic 'TRUE' value. When the conductor is proximate to the portion 322 corresponding to a non-sensing region of the capacitive sensor array 306, the capacitance of the combined sensing capacitor of the capacitive sensor array 306 is not changed in response to this conductor. This can be detected, and used to set the bit of the rotary encoder output corresponding to the capacitive sensor array 306 to a logic 'FALSE' value. Each bit of the rotary encoder output corresponding to each of the capacitive sensor arrays 302-306 at the example angle 318, and other angles, can be determined in this manner. In the example of FIG. 3, the rotary encoder output for the angle 318 is the binary word 00001. As shown in FIG. 3, the example capacitive sensing regions 310, 312 and the example non-sensing regions 314, 316 of the capacitive sensor arrays 302-306 are arranged to form a pattern of capacitive sensing regions corresponding to a binary encoding of rotational positions. That is, when the conductor rotates counter-clockwise, successive rotary encoder outputs are the binary words 00011, 00010, 00110, . . . In the example of FIG. 3, the rotary encoder outputs of adjacent rotational positions differ in only one bit position. While an example arrangement is shown in FIG. 3, other arrangements corresponding to other sequences of rotary encoder outputs may be implemented. For instances, an incrementing sequence of rotary encoder outputs (e.g., 00001, 00010, 00011, etc.) may be implemented.

In the example of FIG. 3, the shapes and sizes of the regions 310, 312, 314 and 316 vary between the capacitive sensor arrays 302-306. Because the capacitive sensor array 302 has a larger circumference than the capacitive sensor array 306, the regions 310, 312, 314 and 316 of the capacitive sensor array 302 are wider than the regions 310, 312, 314 and 316 of the capacitive sensor array 306. To compensate for this difference, in the example of FIG. 3, the regions 310, 312, 314 and 316 of the capacitive sensor array 302 are shorter in the radial direction than the regions 310, 312, 314 and 316 of the capacitive sensor array 306. By compensating in this way for the differences in width, the capacitances of the capacitive sensor arrays 302-306 can be made approximately equal. While example region shapes are shown in FIG. 3, other shapes may be used. Moreover, the capacitive sensor arrays 302-306 may be implemented to have difference capacitances.

Figure 6:
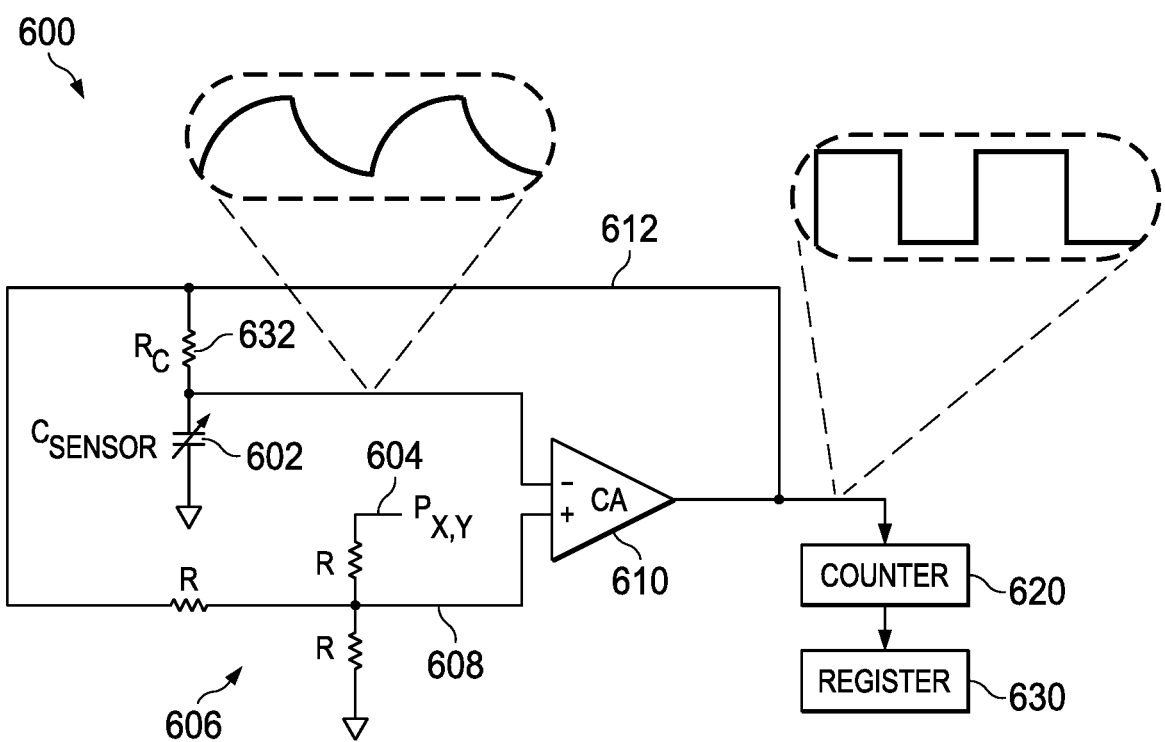
FIG. 6 is a schematic diagram of an example circuit that may be used to implement an example sense circuit of FIG. 1, in accordance with the disclosure.
Figure 7:
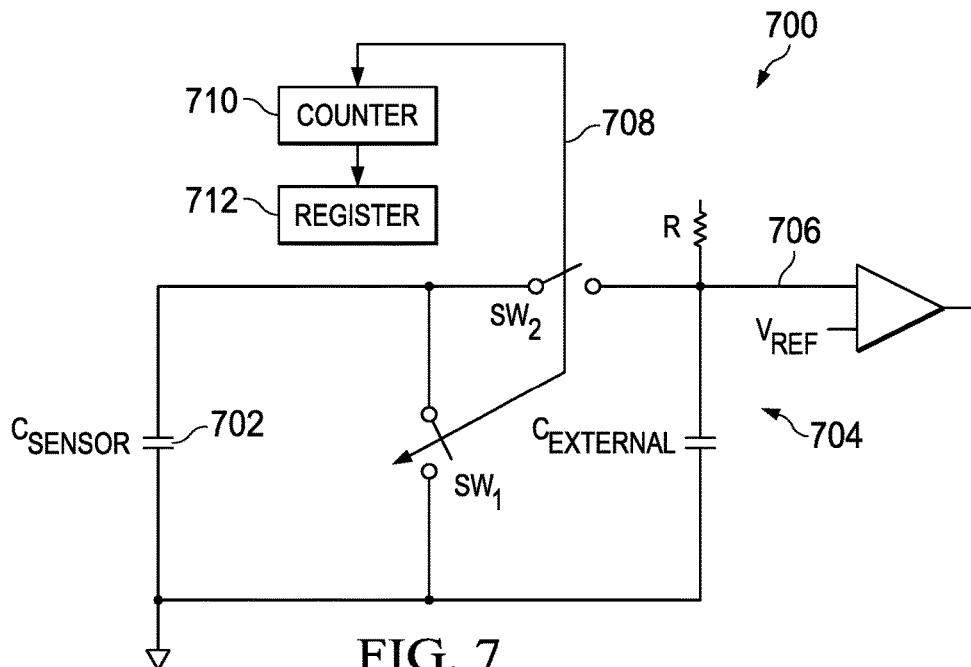
FIG. 7 is a schematic diagram of another example circuit that may be used to implement an example sense circuit of FIG. 1, in accordance with the disclosure.
Figure 8:
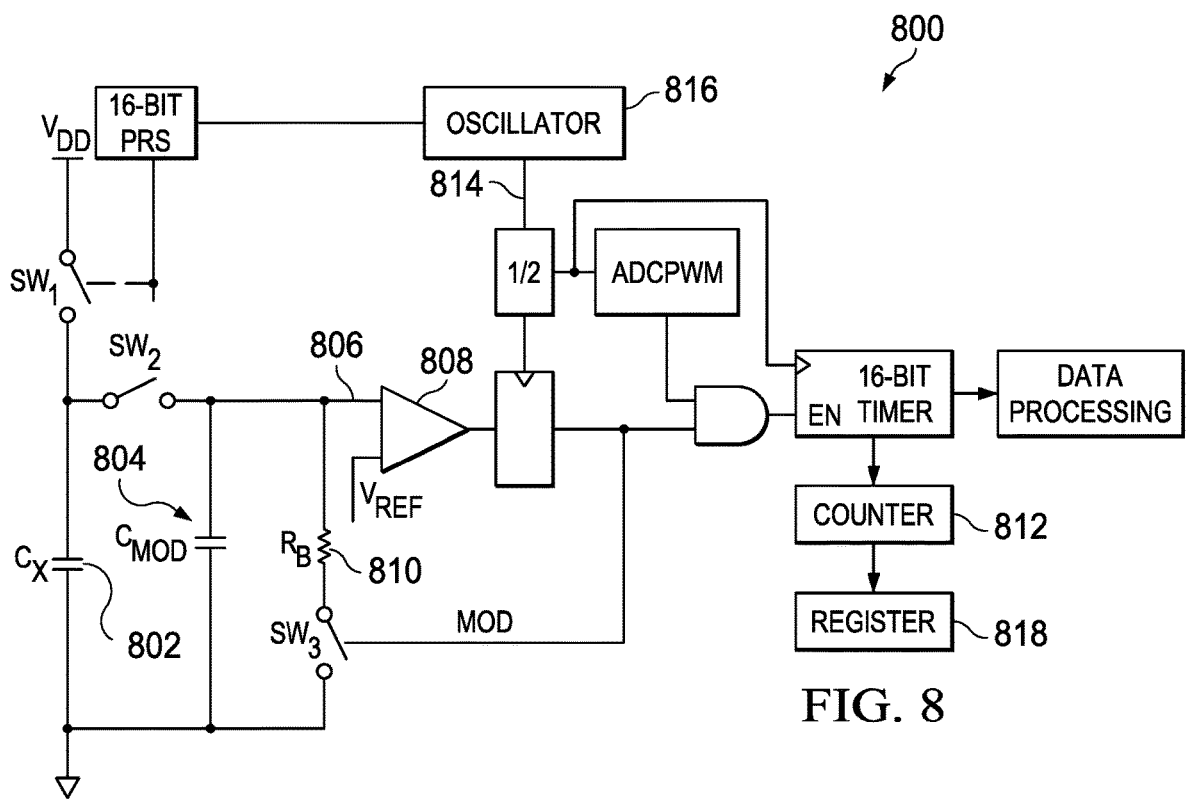
FIG. 8 is a schematic diagram of yet another example circuit that may be used to implement an example sense circuit of FIG. 1, in accordance with the disclosure.

To measure the capacitances of the capacitive sensor arrays 302-306, the example rotary encoder PCB 300 of FIG. 3 includes example sense circuits 332-336 for respective ones of the example capacitive sensor arrays 302-306. Example sense circuits include, but are not limited to, a charge-transfer circuit, a relaxation-oscillator circuit, a sigma-delta modulator circuit, a successive approximation circuit, etc. FIGS. 6, 7, and 8 are schematic diagrams of non-limiting example circuits 600, 700, and 800, respectively, which may be used to implement the example sense circuits 332-336 of FIG. 3. As discussed below in connection with FIGS. 6-8, each of the example sense circuits 332-336 has a signal 616, 712, 818 having a cycle frequency that represent the capacitance of the corresponding capacitive sensor array 302-306.

To determine the rotational position of the rotatable shaft 112, the example rotary encoder PCB 300 includes an example controller 340, such as that shown in FIG. 10 and discussed below. As discussed below, the example controller 340 of FIG. 3 periodically and/or aperiodically obtains a cycle count of a signal (e.g., the example signals 616, 712, 818) of each of the sense circuits 332-336. The controller 340 compares each cycle count to a threshold to determine whether the capacitance of the corresponding capacitive sensor array 302-306 has increased due to proximity of a conductor to a capacitive sensing region 310, 312 of the capacitive sensor array 302-306. If the capacitance of a capacitive sensor array 302-306 has increased sufficiently to represent proximity to a conductor (e.g., its cycle count exceeds a threshold), the bit of the rotary encoder output corresponding to the capacitive sensor array 302-306 is set to a logic 'TRUE' value. Otherwise, the bit is set to a logic 'FALSE' value.

In some examples, the example controller 340 of FIG. 3 uses the rotary encoder output to determine (decode, estimate, etc.) the absolute rotational position of the rotatable shaft 112. In some examples, the controller 340 uses two rotary encoder outputs to determine a change in rotational position. In some examples, rotary encoder outputs can be accumulated to determine a cumulative amount of rotation.

In some examples, a difference in two rotary encoder outputs can be implemented to determine a change in rotational position.

In the example of FIG. 3, an integrated circuit (IC) 350 located in a central area 352 of the rotary encoder PCB 300 implements the controller 340 and portions (e.g., a comparator, a counter and a count register) of the sense circuits 332-336. Example ICs 342 include, but are not limited to, MSP430 microcontrollers with CapTIvate™ technology by Texas Instruments Incorporated, CapSense® Controllers by Cypress Semiconductor Corp., and maXTouch® Touchscreen Controllers by Microchip Technology Inc.

Figure 4:
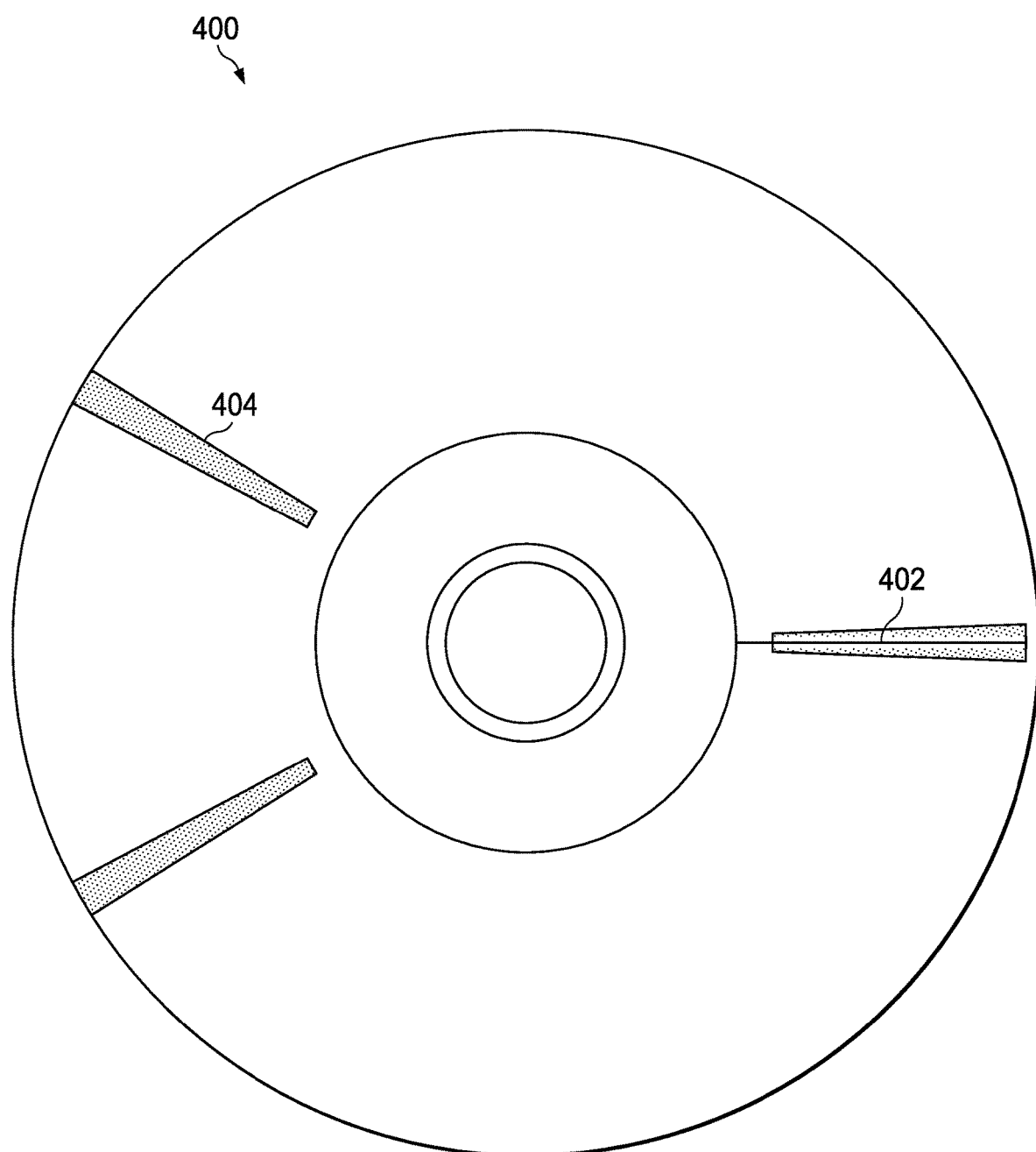
FIG. 4 is a schematic view of an example conductor PCB, in accordance with the disclosure, that may be used together with the example rotary encoder PCB of FIG. 3.

FIG. 4 is a schematic diagram of an example conductor PCB 400 that may be used to implement the example conductor PCB 150 of FIGS. 1 and 2. The example conductor PCB 400 of FIG. 4 includes a radial wedge-shaped conductor 402. The conductor 402 has a shape corresponding collectively to the regions 310, 312, 314 and 316 for an angle, such as the example angle 318.

In operation, the example conductor PCB 400 rotates relative to the example rotary encoder PCB 300. When the conductor 402 overlaps with capacitive sensing regions 310, 312 at an angle, the capacitive sensor arrays 302-306 corresponding to those capacitive sensing regions 310, 312 will have their capacitances increased due to the proximity of the conductor 402.

Figure 5:
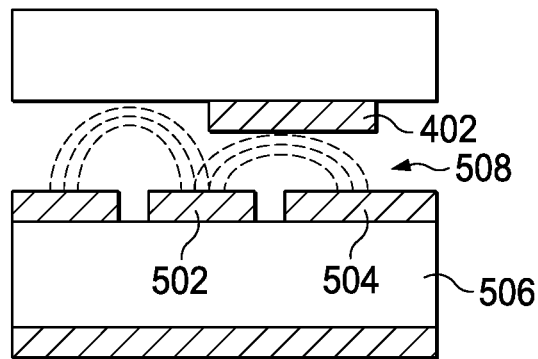
FIG. 5 is a side view of an example portion of the example PCB assembly of FIGS. 1 and 2, in accordance with the disclosure.

The capacitance of a capacitive sensor array 302-306 is formed by a conductive region 502 (see FIG. 5) of a capacitive sensing region 310, 312, and an example ground region 504 formed on an example PCB substrate 506. In some examples, the conductive region 502 and the ground region 504 are copper pads on the PCB substrate 506. The example ground region 504 is spaced apart from the example conductive region 502 (e.g., not in physical contact, not in electrical contact, etc.) to form an example electric field 508. As the example conductor PCB 400 moves, the conductor 402 can move into, through, and out of the electric field 508. When the conductor 402 is at least partially above or near the electric field 508 (e.g., proximate to), the conductor 402 interferes with the electric field 518, thereby increasing the capacitance of the capacitive sensor array 302-306.

In some examples, the ground region 504 is implemented around the conductive region 502, e.g., between the regions 310, 312, 314 and 316 in FIG. 3. In some examples, the ground region 504 is implemented as a common ground region in the central area 352 of the rotary encoder PCB 300, and the conductor 402 extends inward to overlap with the common ground region on the rotary encoder PCB 300. In the example of FIG. 3, self-capacitance is implemented. However, other forms of capacitance, such as mutual-capacitance may be implemented.

In some examples, a conductor PCB includes one or more additional conductors, such as an example conductor 404. Multiple conductors can be implemented, for example, in flow meter applications were we only need to monitor the number of rotations instead of the conductor's position. In such circumstances, the additional conductors 404 can improve accuracy by implementing a larger coupling area. The additional conductors 404 can be arranged in any number of ways.

FIG. 6 is a schematic diagram of an example sense circuit 600 for a combined sensing capacitor 602 for a capacitive sensor array 302-306, in the form of an oscillator circuit. The example sense circuit 600 may be used to implement the example sense circuits 332-336 of FIG. 3. When a control input 604 is set to a logic high (e.g., equal to a supply voltage Vcc), an example resistor ladder network 606 creates an example reference input 608 for an example comparator 610 that changes with an example output 612 of the comparator 610. The example reference input 608 toggles and has a polarity that is opposite the charge and discharge of the capacitive sensor 602. In the example of FIG. 6, if the resistors R of the resistor ladder network 606 have approximately equal resistances, then the oscillation or cycle frequency $f_{OSC}$ of the output 612 of the comparator 610 can be expressed mathematically as:

$$f_{OSC}=1/(1.386R_C C_{SENSOR}),$$

where $C_{SENSOR}$ is the capacitance of the capacitive sensor 602, which varies responsive to the proximity of a conductor, such as the example conductor 152 or the example conductor 402. As discussed above in connection with FIGS. 3-5, as a conductor interferes with the electric field 508, the capacitance of the capacitive sensor 604 increases and, thus, the cycle frequency $f_{OSC}$ of the output 612 of the comparator 610 increases. That is, the cycle frequency $f_{OSC}$ can be used as a measure of the capacitance of the capacitive sensor 602.

To determine (e.g., estimate, measure, etc.) the cycle frequency $f_{OSC}$ of the output signal 612 of the comparator 610, the example sense circuit 600 includes an example counter 620 and the example count register 630. The example counter 620 counts cycles of the output signal 612 by, for example, counting rising or falling edges of the output 612. At periodic intervals, the current cycle count is stored in the example count register 630 for subsequent retrieval, and the counter 620 is reset. The larger the count stored in the count register 630, the higher the cycle frequency $f_{OSC}$ of the output 612, and the larger the capacitance of the capacitive sensor 602, which indicates a larger interference of the capacitive sensor 602 by a conductor.

FIG. 7 is a schematic diagram of another example sense circuit 700 for a combined sensing capacitor 702 for a capacitive sensor array 302-306, in the form of a charge-transfer circuit. The example sense circuit 700 of FIG. 7 may be used to implement the example sense circuits 332-336 of FIG. 3. In FIG. 7, a resistor-capacitor (RC) network 704 is used to charge a circuit voltage 706. Charge is periodically transferred from the sense capacitor 702 to the RC network 704 by controlling with a signal 708 which controls example switches $SW_1$ and $SW_2$. When a conductor is proximate to the capacitive sensor 702, the capacitance of the capacitive sensor 702 increases, and more charge is transferred from the capacitive sensor 702 to the RC network 704 per cycle of the signal 708. By counting, with a counter 710, the number of cycles of the signal 708 needed for the circuit voltage 706 to exceed a threshold voltage $V_{REF}$, a measure of the capacitance of the capacitive sensor 702 can be determined. At periodic intervals, the current count is stored in an example count register 712 for subsequent retrieval, and the counter 710 is reset. The smaller the count stored in the count register 702, the larger the capacitance of the capacitive sensor 704, which indicates a larger interference of the capacitive sensor 704 by a conductor.

FIG. 8 is a schematic diagram of yet another example sense 800 for a combined sensing capacitor 802 for a capacitive sensor array 302-306, in the form of a sigma-delta sense circuit. The example sense circuit 800 of FIG. 8 may be used to implement the example sense circuits 332-336 of FIG. 3. In FIG. 8, the capacitive sensor 802 charges a resistor-capacitor (RC) network 804 that charges a circuit voltage 806. When a conductor is proximate to the capacitive sensor 802, the capacitance of the capacitive sensor 802 increases, and charge is transferred faster from the capacitive sensor 802 to the circuit voltage 806. Once the circuit voltage 806 exceeds a threshold reference voltage $V_{REF}$, a comparator 808 is tripped, and discharge of the circuit voltage 806 through a resistor 810 begins. As the capacitance of the capacitive sensor 802 increases, the discharging slows as charging by the capacitive sensor 802 continues. Counting, with a counter 812, the number of cycles of an output signal 814 of an oscillator 816 until discharging completes, the capacitance of the capacitive sensor 802 can be determined. At periodic intervals, the current count is stored in an example count register 818 for subsequent retrieval, and the counter 812 is reset. The larger the count stored in the count register 818, the larger the capacitance of the capacitive sensor 802, which indicates a larger interference of the capacitive sensor 802 by a conductor.

While example implementations of the example motor assembly 100, the example capacitive-sensing rotary encoder assembly 120, the example PCB assembly 130, the example rotary encoder PCB 140, the example conductor PCB 150, the example conductor 152, the example rotary encoder PCB 300, the example capacitive sensor arrays 302-306, the example regions 310, 312, 314 and 316, the example sense circuits 332-336, the example controller 340, the example IC 350, the example conductor PCB 400, the example conductor 402, the example sense circuits 700, 800 and 900, the example counters 620, 710 and 812, the example count registers 630, 712 and 818 are shown in FIGS. 1-8, one or more of the elements, processes and/or devices illustrated in FIGS. 1-8 may be combined, divided, re-arranged, omitted, eliminated and/or implemented in any other way. Further, the example motor assembly 100, the example capacitive-sensing rotary encoder assembly 120, the example PCB assembly 130, the example rotary encoder PCB 140, the example conductor PCB 150, the example conductor 152, the example rotary encoder PCB 300, the example capacitive sensor arrays 302-306, the example regions 310, 312, 314 and 316, the example sense circuits 332-336, the example controller 340, the example IC 350, the example conductor PCB 400, the example conductor 402, the example sense circuits 700, 800 and 900, the example counters 620, 710 and 812, the example count registers 630, 712 and 818 of FIGS. 1-8 may be implemented by hardware, software, firmware and/or any combination of hardware, software, and/or firmware. Thus, for example, any of the example motor assembly 100, the example capacitive-sensing rotary encoder assembly 120, the example PCB assembly 130, the example rotary encoder PCB 140, the example conductor PCB 150, the example conductor 152, the example rotary encoder PCB 300, the example capacitive sensor arrays 302-306, the example regions 310, 312, 314 and 316, the example sense circuits 332-336, the example controller 340, the example IC 350, the example conductor PCB 400, the example conductor 402, the example sense circuits 700, 800 and 900, the example counters 620, 710 and 812, the example count registers 630, 712 and 818 could be implemented by one or more analog or digital circuit(s), logic circuits, programmable processor(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example motor assembly 100, the example capacitive-sensing rotary encoder assembly 120, the example PCB assembly 130, the example rotary encoder PCB 140, the example conductor PCB 150, the example conductor 152, the example rotary encoder PCB 300, the example capacitive sensor arrays 302-306, the example regions 310, 312, 314 and 316, the example sense circuits 332-336, the example controller 340, the example IC 350, the example conductor PCB 400, the example conductor 402, the example sense circuits 700, 800 and 900, the example counters 620, 710 and 812, the example count registers 630, 712 and 818 is/are hereby expressly defined to include a tangible computer-readable storage medium storing the software and/or firmware. Further still, the example motor assembly 100, the example capacitive-sensing rotary encoder assembly 120, the example PCB assembly 130, the example rotary encoder PCB 140, the example conductor PCB 150, the example conductor 152, the example rotary encoder PCB 300, the example capacitive sensor arrays 302-306, the example regions 310, 312, 314 and 316, the example sense circuits 332-336, the example controller 340, the example IC 350, the example conductor PCB 400, the example conductor 402, the example sense circuits 700, 800 and 900, the example counters 620, 710 and 812, the example count registers 630, 712 and 818 may include one or more elements, processes and/or devices in addition to, or instead of, those illustrated in FIGS. 1-8, and/or may include more than one of any or all of the illustrated elements, processes and devices.

Figure 9:
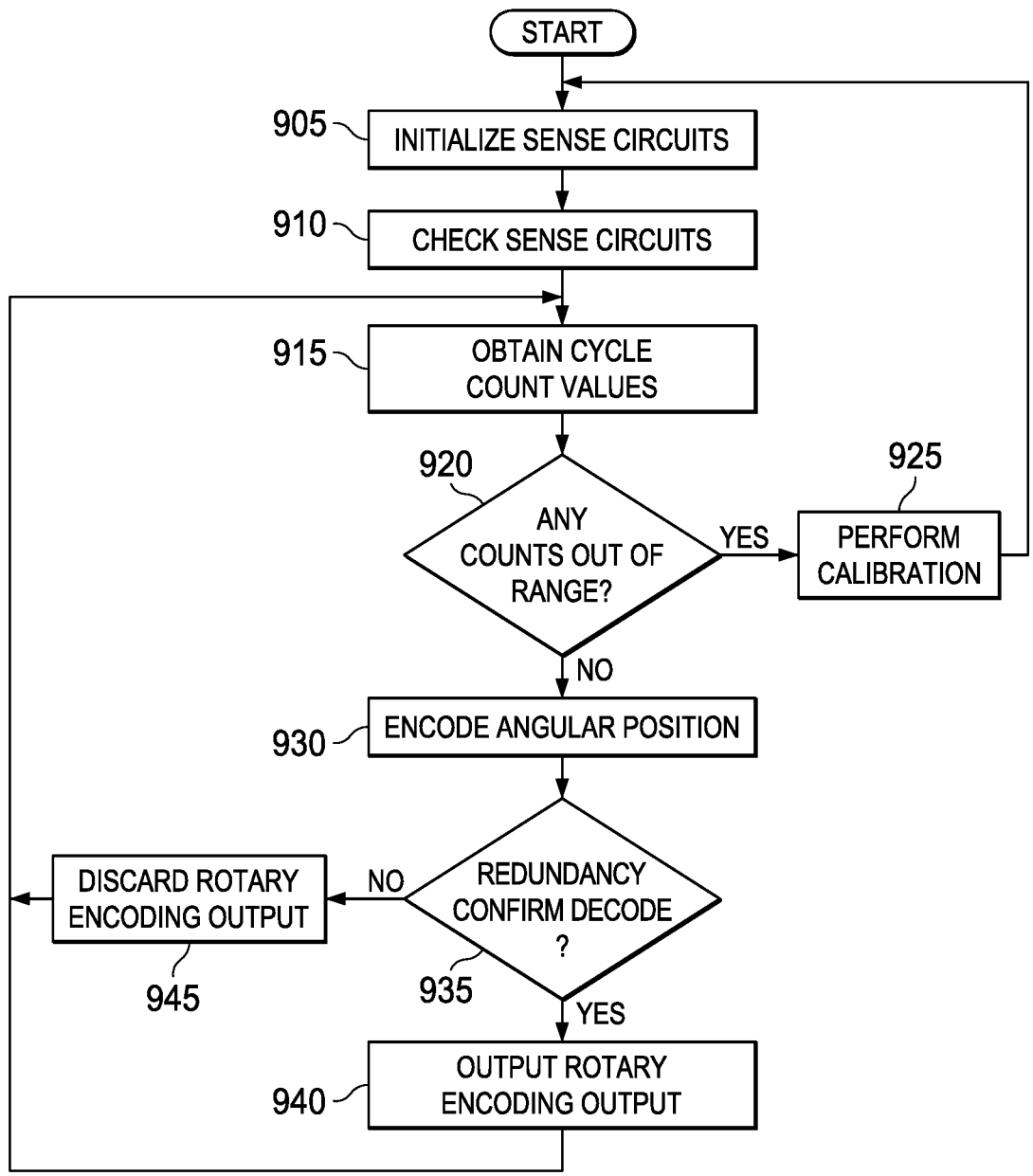
FIG. 9 is a flow diagram representing an example process that may be implemented as machine-readable instructions that may be executed to implement the example capacitive-sensing rotary encoder assembly to determine encode rotational positions of a rotatable shaft of a motor.

FIG. 9 is a flow diagram representative of example process(es) that may be implemented as coded computer-readable instructions, the coded instructions may be executed to implement the capacitive-sensing rotary encoder assembly 120 to encode the angular position of the rotatable shaft 112 of the motor 110. In this example, the coded instructions comprise one or more programs for execution by a processor such as the processor 1012 shown in the example processor platform 1000 discussed below in connection with FIG. 10. The program(s) may be embodied in the coded instructions and stored on one or more tangible computer-readable storage mediums associated with the processor 1012. One or more of the program(s) and/or parts thereof could alternatively be executed by a device other than the processor 1012. One or more of the programs may be embodied in firmware or dedicated hardware. Further, although the example process(s) is/are described with reference to the flowchart illustrated in FIG. 9, many other methods of implementing the capacitive-sensing rotary encoder assembly 120 may alternatively be used. For example, the order of execution of the blocks may be changed, and/or some of the blocks described may be changed, eliminated, or combined.

As mentioned above, the example process(es) of FIG. 9 may be implemented using coded instructions (e.g., computer-readable instructions and/or machine-readable instructions) stored on one or more tangible computer-readable storage mediums. As used herein, the term tangible computer-readable storage medium is expressly defined to include any type of computer-readable storage device and/or storage disk and to exclude propagating signals and to exclude transmission media. As used herein, "tangible computer-readable storage medium" and "tangible machine-readable storage medium" are used interchangeably. Additionally, or alternatively, the example process(es) of FIG. 9 may be implemented using coded instructions (e.g., computer-readable instructions and/or machine-readable instructions) stored on one or more non-transitory computer mediums. As used herein, the term non-transitory computer-readable storage medium is expressly defined to include any type of computer-readable storage device and/or storage disk and to exclude propagating signals and to exclude transmission media. As used herein, "non-transitory computer-readable storage medium" and "non-transitory machine-readable storage medium" are used interchangeably.

Example tangible computer-readable storage mediums include, but are not limited to, any tangible computer-readable storage device or tangible computer-readable storage disk such as a memory associated with a processor, a memory device, a flash drive, a digital versatile disk (DVD), a compact disc (CD), a Blu-ray disk, a floppy disk, a hard disk drive, a random access memory (RAM), a read-only memory (ROM), etc. and/or any other storage device or storage disk in which information is stored for any duration (e.g., for extended time periods, permanently, for brief instances, for temporarily buffering, and/or for caching of the information).

The example process of FIG. 9 includes the controller 340 initializing the sense circuits (e.g., any of the example sense circuits 332-336, 600, 700, and 800) (block 905), and checking the capacitive sensor arrays (e.g., any of the example capacitive sensor arrays 302-306 of FIG. 3) for fault conditions, such as an open, a short, a high impedance state, etc. (block 910). Such conditions can be identified, for example, by cycle counts that are too high, too low, don't changes as the motor rotates, etc.

The controller 340 obtains the cycle count values from the count registers (e.g., any of count registers 630, 712 and 818) (block 915) and, if any are out of bounds (block 920), performs a calibration process on the capacitive sensor arrays and/or sense circuits (block 925). An example calibration process, for the example sense circuit 600 of FIG. 6, changes the threshold positive input of the comparator 610, or resistance of a resistor 632 to move the output in the range, when the capacitance to digital counts conversion is out of the range. Control returns to block 905 to re-initialize the sense circuits.

If the cycle counts are in range (block 920), the cycles counts are used to form bits of the rotary encoding output for the angular position of the rotatable shaft 112 (block 930). If redundancy information (if available) confirms the angular position (block 935), the rotary encoding output is output and/or used for motor control, flow meter, or other purposes (block 940).

Returning to block 935, if the redundancy information does not confirm the rotary encoding (block 915), the rotary encoding output is discarded (block 945), and control returns to block 915 to obtain new cycle counts (block 915).

Figure 10:
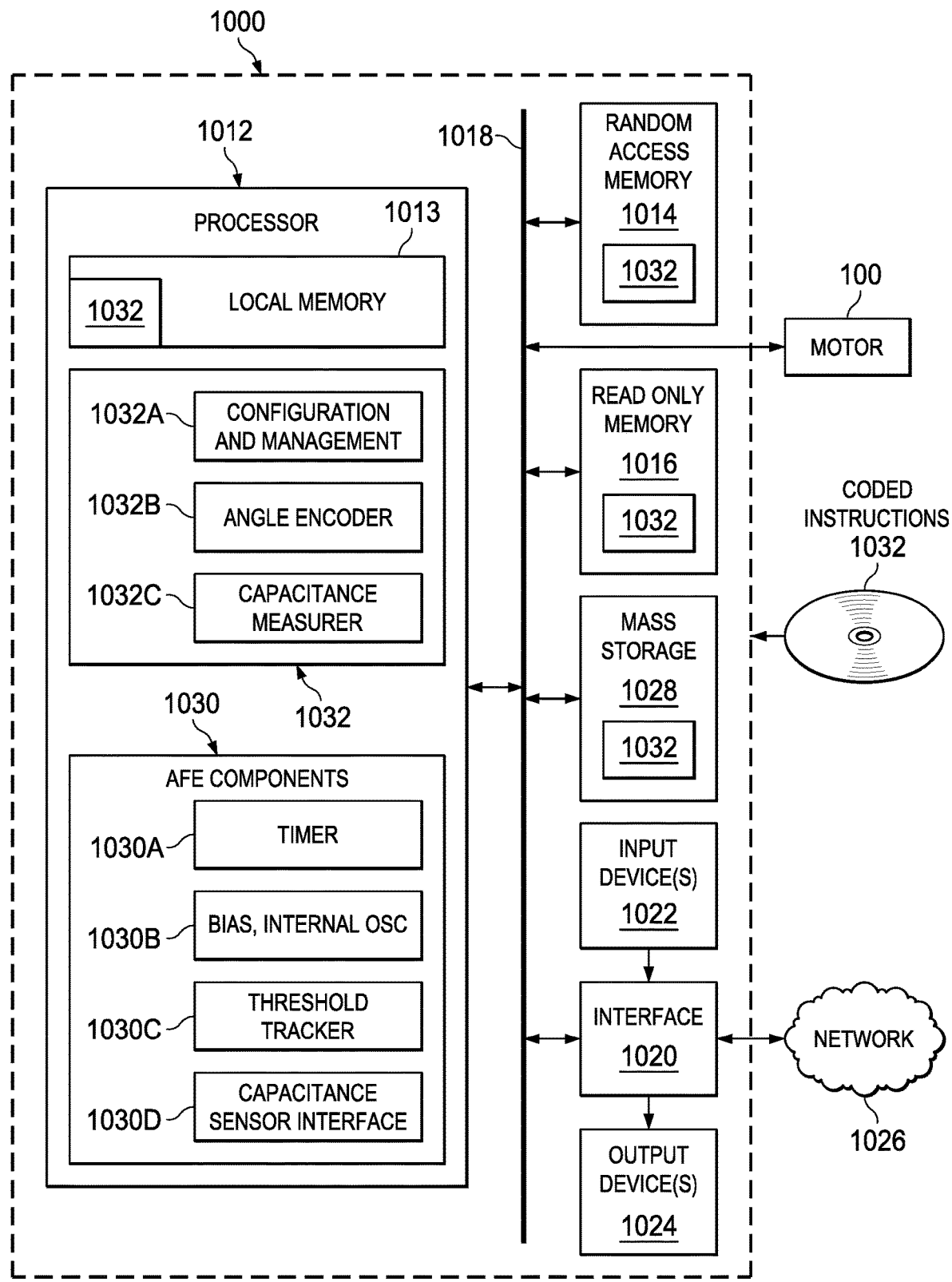
FIG. 10 illustrates an example processor system structured to execute the example instructions of FIG. 9 to implement the example capacitive-sensing rotary encoder assemblies disclosed herein.

FIG. 10 is a block diagram of an example processor platform 1000 configured to, among other things, execute the process(es) of FIG. 9 to implement the example capacitive-sensing rotary encoder assembly 120 of FIGS. 1 and 2. The processor platform 1000 can be, for example, a server, a personal computer, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, GPUs, or controllers from any desired family or manufacturer.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAIVIBUS Dynamic Random Access Memory (RDRAM) and/or any other type of random access memory (RAM) device. The non-volatile memory 1014 may be implemented by flash memory and/or any other desired type of memory device. Access to the main memory 1014, 1016 is controlled by a memory controller.

In the illustrated example, any one or more of the local memory 1013, the RAM 1014, the read only memory 1016, and/or a mass storage device 1028 may implement any of the example count registers 630, 712 and 818.

In some examples, the example processor 1012 communicates with the example motor 110 via the bus 1018, and/or another input/output interface (e.g., external IC pins).

The processor platform 1000 of the illustrated example also includes an interface circuit 1020. The interface circuit 1020 may be implemented by any type of interface standard, such as an Ethernet interface, a universal serial bus (USB), and/or a peripheral component interconnect (PCI) express interface.

In the illustrated example, one or more input devices 1022 are connected to the interface circuit 1020. The input device(s) 1022 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system. In some examples, the input devices 1022 implement any or a portion of any of the example rotary encoder PCB 140, the example capacitive sensor arrays 302-306, the regions 310, 312, 314 and 316, and the sense circuits 332-336, 500, 600 and 700.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1020 of the illustrated example, thus, typically includes a graphics driver card, a graphics driver chip or a graphics driver processor. In some examples, one or more output devices 1024 are used to control the motor 110.

In some examples, the processor 1012 includes analog front-end (AFE) components 1030 that enable the processor 1012 to control and/or receive inputs from the motor 110 and/or the capacitive-sensing rotary encoder assembly 120. Example AFE components 1030 include, but are not limited to, an example timer 1030A to gate the storage of cycle counts in the count registers, bias and internal sense circuits 1030B, an example threshold tracker 1030C to monitor cycle counts and adjust thresholds for determining whether an oscillator count is out of range, and a capacitive sensor interface 1030D for controlling and receiving information from the sense circuits 1030B.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

Coded instructions 1032 include the machine-readable instructions of FIG. 9 and may be stored in the mass storage device 1028, in the volatile memory 1014, in the non-volatile memory 1016, and/or on a removable tangible computer readable storage medium such as a CD or DVD. Example coded instructions include, but are not limited to, configuration and management functions 1032A to implement the overall control and operation of the motor 110, an angle encoder 1032B to encode angular positions, and a capacitance measurer 1032C to determine capacitances by controlling sense circuits and counters.

From the foregoing, it will be appreciated that methods, apparatus and articles of manufacture have been disclosed which enhance motor control and flow meter operations by improving the accuracy and speed of encoding the angular position of a rotatable shaft of a motor. Additional examples of which include, but are not limited to:

An example rotary encoder PCB structured to be mounted to a motor includes a plurality of circumferential capacitive sensor arrays, each of the plurality of capacitive sensor arrays having an arrangement of electrically-coupled conductive regions, wherein the capacitive sensor arrays and the capacitive sensing regions of the capacitive sensor arrays are arranged to form a pattern of capacitive sensing regions corresponding to a binary encoding of rotational positions, a plurality of sense circuits for respective ones of the plurality of capacitive sensor arrays, an input of each sense circuit electrically coupled to the electrically-coupled conductive regions of the respective capacitive sensor array, an output of each circuit providing a signal that represents the capacitance of the respective capacitive sensor array, and a controller communicatively coupled to the circuits to receive the output of each circuit, the controller to determine a rotational position of a rotatable shaft of the motor based the outputs.

An example tangible computer-readable storage medium stores instructions that, when executed, cause a machine to encode a rotational position of a rotatable shaft of a motor by performing at least receiving a plurality of signals representing capacitances of respective ones of a plurality circumferential capacitive sensor arrays, and determining a plurality of binary bits of a rotary encoder output for respective ones of the capacitances of the respective ones of the plurality of capacitive sensor arrays, the rotary encoder output changing as a conductor changes the plurality of capacitances of the respective ones of the capacitive sensor array, as it rotates together with the rotatable shaft of the motor relative to the plurality of capacitive sensor arrays.

An example method to encode a rotational position of a rotatable shaft of a motor, the method includes receiving a plurality of signals representing capacitances of respective ones of a plurality circumferential capacitive sensor arrays, and determining a plurality of binary bits of a rotary encoder output for respective ones of the capacitances of the respective ones of the plurality of capacitive sensor arrays, the rotary encoder output changing as a conductor changes the plurality of capacitances of the respective ones of the capacitive sensor array, as it rotates together with the rotatable shaft of the motor relative to the plurality of capacitive sensor arrays.

In this specification and the appended claims, the singular forms "a," "an" and "the" do not exclude the plural reference unless the context clearly dictates otherwise. Further, conjunctions such as "and," "or," and "and/or" are inclusive unless the context clearly dictates otherwise. For example, "A and/or B" includes A alone, B alone, and A with B. Further, as used herein, when the phrase "at least" is used in this specification and/or as the transition term in a preamble of a claim, it is open-ended in the same manner as the term "comprising" is open ended.

Further, connecting lines or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the embodiments disclosed herein unless the element is specifically described as "essential" or "critical".

Terms such as, but not limited to, approximately, substantially, generally, etc. are used herein to indicate that a precise value or range thereof is not required and need not be specified. As used herein, the terms discussed above will have ready and instant meaning to one of ordinary skill in the art.

Although certain example methods, apparatuses and articles of manufacture have been described herein, the scope of coverage of this patent is not limited thereto. It is to be understood that terminology employed herein is for the purpose of describing particular aspects, and is not intended to be limiting. On the contrary, this patent covers all methods, apparatus and articles of manufacture fairly falling within the scope of the claims of this patent.

What is claimed is:

1. An apparatus comprising:
    a first capacitive sensor array having an output, wherein the first capacitive sensor array includes a first plurality of regions, and each of the first plurality of regions having a first set of dimensions;
    a second capacitive sensor array having an output the second capacitive sensor array separate from the first capacitive sensor array, wherein the second capacitive sensor array includes a second plurality of regions, and each of the second plurality of regions having a second set of dimensions different from the first set of dimensions; and
    a controller having a first input, a second input, and a binary word output, the first input is coupled to the output of the first capacitive sensor array, the second input is coupled to the output of the second capacitive sensor array, and the controller is configured to generate a binary word at the binary word output based on the first input and the second input.

2. The apparatus of claim 1, wherein the controller is configured to determine a rotational position of a rotatable shaft based on the output of the first capacitive sensor array and the output of the second capacitive sensor array.

3. The apparatus of claim 1, wherein the second capacitive sensor array is concentric to the first capacitive sensor array.

4. The apparatus of claim 1, further comprising a counter having a first input and a second input, the first input is coupled to the output of the first capacitive sensor array, the second input is coupled to the output of the second capacitive sensor array, the counter is configured to determine a cycle count; wherein the counter is configured to store the cycle count in a count register.

5. The apparatus of claim 1, wherein a first bit of the binary word represents the output of the second capacitive sensor array and a second bit of the binary word represents the output of the first capacitive sensor array.

6. The apparatus of claim 1, further comprising a third capacitive sensor array, the third capacitive sensor array is located concentrically between the first capacitive sensor array and the second capacitive sensor array.

7. The apparatus of claim 6, wherein the third capacitive sensor array has an output, the controller has a third input coupled to the output of the third capacitive sensor array, the controller is configured to generate the binary word based on the first input, the second input, and the third input, and the binary word changes in only one bit position between adjacent rotational positions of a rotatable shaft.

8. The apparatus of claim 1, wherein the apparatus is configured to remain stationary with respect to rotation of a rotatable shaft.

9. The apparatus of claim 1, wherein:
each of the first plurality of regions has a capacitance value; and
each of the second plurality of regions has the capacitance value.

10. An apparatus comprising:
a first sensor array having a first output;
a second sensor array having a second output;
a controller configured to output a binary word based on the first output and the second output;
wherein the first sensor array includes a first plurality of regions, and each of the first plurality of regions having a first set of dimensions; and
wherein the second sensor array includes a second plurality of regions, wherein the second capacitive sensor array includes a second plurality of regions, and each of the second plurality of regions having a second set of dimensions different from the first set of dimensions.

11. The apparatus of claim 10, wherein:
the first output is a least significant bit of the binary word; and
the second output is a most significant bit of the binary word.

12. The apparatus of claim 10, wherein:
the first sensor array is concentric with the second sensor array.

13. The apparatus of claim 10, wherein:
the first sensor array and the second sensor array are capacitive sensors configured to sense a presence of a conductor.

14. The apparatus of claim 13, further comprising:
a sense circuit coupled to one of the capacitive sensors, wherein the sense circuit includes one of a charge-transfer circuit, a relaxation-oscillator circuit, a sigma-delta modulator circuit, and a successive approximation circuit.

15. The apparatus of claim 10, wherein:
each region of the first plurality of regions and each region of the second plurality of regions is one of a capacitive sensing region or a non-sensing region.

16. The apparatus of claim 15, wherein:
each region of the first plurality of regions is longer radially than each region of the second plurality of regions.

17. The apparatus of claim 16, further comprising:
a radial wedge-shaped conductor that corresponds collectively to the first plurality of regions and the second plurality of regions.

18. The apparatus of claim 16, wherein:
the first plurality of regions and the second plurality of regions are configured to form a pattern corresponding to a binary encoding of a position.

19. The apparatus of claim 18, wherein:
the position indicates a rotational position.

20. The apparatus of claim 10, wherein:
each of the first plurality of regions has a capacitance value; and
each of the second plurality of regions has the capacitance value.

\* \* \* \* \*